United States Patent
Vellore et al.

(10) Patent No.: US 10,109,514 B2
(45) Date of Patent: *Oct. 23, 2018

(54) VISUAL FEEDBACK FOR PROCESS CONTROL IN RTP CHAMBERS

(71) Applicant: Applied Materials, Inc., Santa Clara, CA (US)

(72) Inventors: Kim Vellore, San Jose, CA (US); Dinesh Kanawade, Melville, NY (US); Stephen Moffatt, St. Brelade (JE); Aaron Miller, Sunnyvale, CA (US); Leonid M. Tertitski, Los Gatos, CA (US); Norman L. Tam, Cupertino, CA (US); Michael Liu, Saratoga, CA (US); Colin Fox, Austin, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/675,825

(22) Filed: Aug. 14, 2017

(65) Prior Publication Data

US 2017/0345693 A1 Nov. 30, 2017

Related U.S. Application Data

(63) Continuation of application No. 14/456,682, filed on Aug. 11, 2014, now Pat. No. 9,735,034.

(60) Provisional application No. 61/864,787, filed on Aug. 12, 2013.

(51) Int. Cl.
*H05B 3/68* (2006.01)
*H01L 21/67* (2006.01)

(52) U.S. Cl.
CPC .. *H01L 21/67248* (2013.01); *H01L 21/67115* (2013.01)

(58) Field of Classification Search
CPC ......... H01L 21/67248; H01L 21/67115; H01L 21/67242; H01L 21/67326; H01L 21/67353; H05B 3/44; F27D 21/0014; F27D 19/00; F27B 17/0025
See application file for complete search history.

(56) References Cited

U.S. PATENT DOCUMENTS

| | | | |
|---|---|---|---|
| 6,106,148 A * | 8/2000 | Moslehi | G01J 5/10 219/390 |
| 6,488,407 B1 * | 12/2002 | Kitamura | G01J 5/0003 118/724 |
| 6,825,437 B2 | 11/2004 | Nakano et al. | |
| 7,940,069 B2 | 5/2011 | Andrews et al. | |
| 2004/0079746 A1 * | 4/2004 | Jennings | F27B 5/16 219/390 |
| 2006/0088793 A1 | 4/2006 | Brummel et al. | |

* cited by examiner

*Primary Examiner* — Shawntina Fuqua
(74) *Attorney, Agent, or Firm* — Patterson + Sheridan LLP (57) ABSTRACT

Embodiments of the present disclosure generally relate to methods and apparatus for visual lamp failure detection in a processing chamber, such as an RTP chamber. Visual feedback is facilitated through the use of a wide-angle lens positioned to view lamps within the process chamber. The wide-angle lens is positioned within a probe and secured using a spring in order to withstand high temperature processing. A camera coupled to the lens is adapted to capture an image of the lamps within the process chamber. The captured image of the lamps is then compared to a reference image to determine if the lamps are functioning as desired.

22 Claims, 8 Drawing Sheets

VISUAL FEEDBACK FOR PROCESS CONTROL IN RTP CHAMBERS

CROSS-REFERENCE TO RELATED APPLICATIONS

This application is a Continuation Application of U.S. patent application Ser. No. 14/456,682, filed Aug. 11, 2014, which claims benefit of U.S. Provisional Patent Application Ser. No. 61/864,787, filed Aug. 12, 2013. The aforementioned applications are herein incorporated by reference.

BACKGROUND OF THE DISCLOSURE

Field of the Disclosure

Embodiments of the present disclosure generally relate to visual feedback in rapid thermal processing chambers used for processing substrates, such as semiconductor substrates.

Description of the Related Art

Rapid thermal processing chambers include a plurality of lamps therein which are used for rapidly heating a substrate to desired temperature before allowing the substrate to cool. Uniform heating across the substrate is desirable to ensure substrate-to-substrate uniformity, and well as uniform processing across individual substrates. Substrate heating uniformity is compromised when one of the plurality of lamps burns out or otherwise fails.

In order to detect lamp failure, prior approaches have utilized power detection sensors on circuitry coupled to the plurality of lamps. When a lamp fails, a change in power usage is detected, thus indicating the need for lamp replacement. However, the change in power usage does not indicate which particular lamp failed, but rather, only that a lamp failure has occurred. Therefore, additional diagnostics need to be performed in order to identify the particular failed lamp. The additional diagnostics to identify the failed lamp can be tedious and time consuming.

Therefore, there is a need for an improved method and apparatus for detecting lamp failure.

SUMMARY OF THE DISCLOSURE

Embodiments of the present disclosure generally relate to methods and apparatus for visual lamp failure detection in a processing chamber, such as an RTP chamber. Visual feedback is facilitated through the use of a wide-angle lens positioned to view lamps within the process chamber. The wide-angle lens is positioned within a probe and secured using a spring in order to withstand high temperature processing. A camera coupled to the lens is adapted to capture an image of the lamps within the process chamber. The captured image of the lamps is then compared to a reference image to determine if the lamps are functioning as desired.

In one embodiment, a process chamber comprises a chamber body, a lamp array disposed in the chamber body, a lid disposed over the chamber body, a probe disposed through an opening in the chamber lid, the probe having a wide-angle lens at one end thereof, and a camera coupled to a second end of the probe, the camera adapted to capture an image of the lamp array.

In another embodiment, a process chamber comprises a chamber body, a lamp array disposed in the chamber body, a lid disposed over the chamber body, a probe disposed through an opening in the chamber lid, the probe having a spring at a first end thereof and a wide-angle lens at a second end thereof, the wide-angle lens comprising a plurality of lenses separated by spacers, and a camera coupled to a second end of the probe, the camera adapted to capture an image of the lamp array.

In another embodiment, a method for monitoring lamp performance in a process chamber comprises capturing an image of a lamp array within the process chamber using a wide-angle lens, transferring the captured image to a control unit, and comparing the captured image to a reference image to determine if lamp array is operating at a desired output.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure generally relate to methods and apparatus for visual lamp failure detection in a processing chamber, such as an RTP chamber. Visual feedback is facilitated through the use of a wide-angle lens positioned to view lamps within the process chamber. The wide-angle lens is positioned within a probe and secured using a spring in order to withstand high temperature processing. A camera coupled to the lens is adapted to capture an image of the lamps within the process chamber. The captured image of the lamps is then compared to a reference image to determine if the lamps are functioning as desired.

Figure 1A:
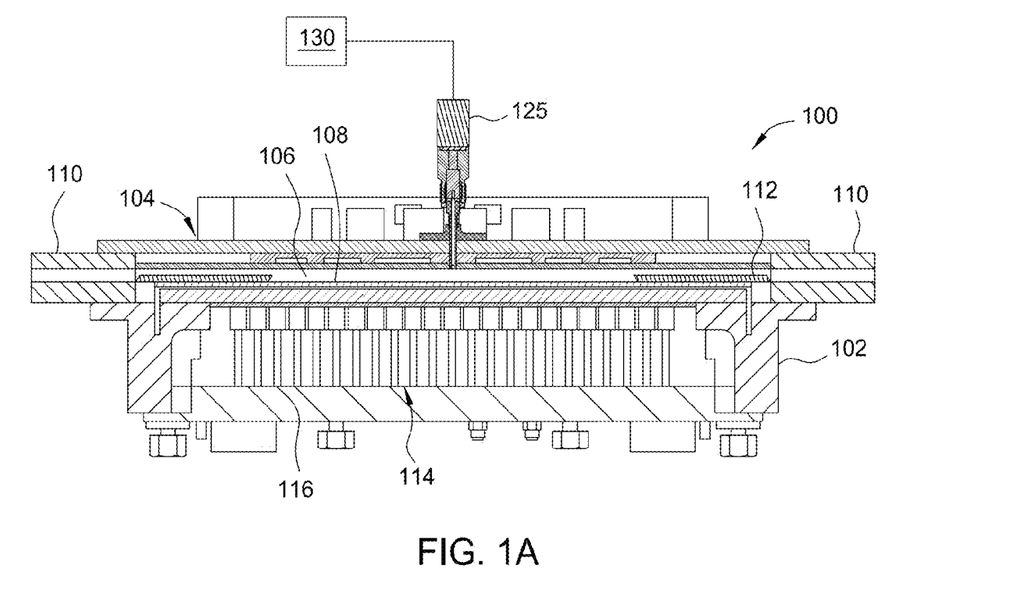
FIGS. 1A and 1B are schematic views of a process chamber, according to one embodiment of the disclosure.
Figure 1B:
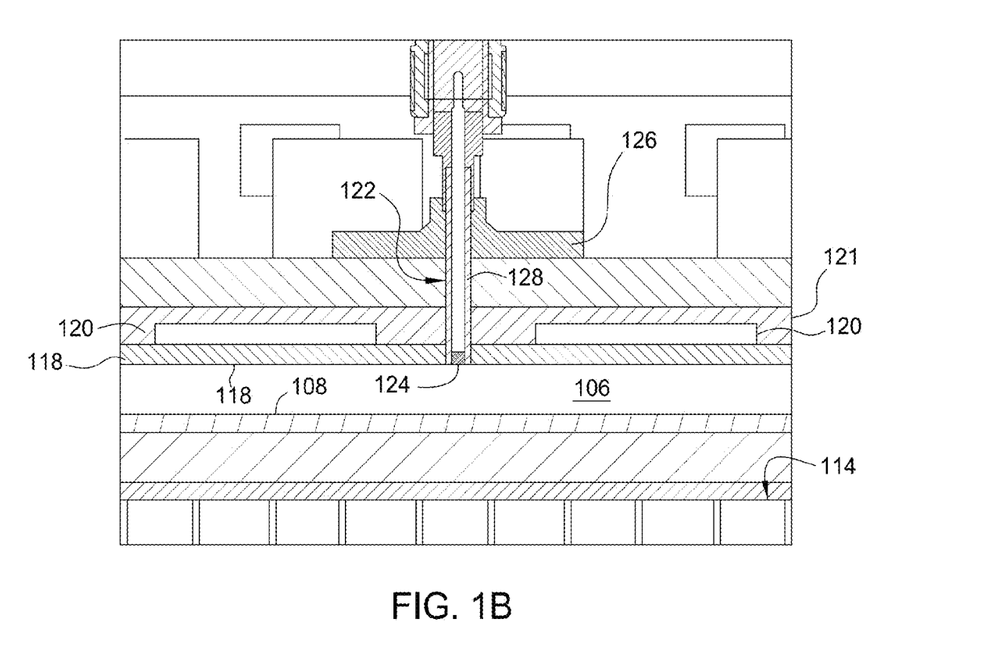

FIGS. 1A and 1B are schematic views of a process chamber, according to one embodiment of the disclosure. The process chamber 100 may be a rapid thermal processing (RTP) chamber available from Applied Materials, Inc., of Santa Clara, Calif. The process chamber 100 includes a body 102 formed from, for example, stainless steel or aluminum, and adapted to support a chamber lid 104 thereon. A process region 106 is defined between the chamber body 102 and the chamber lid 104. A substrate support 108 is positioned at the lower portion of the process region 106 within the chamber body 102. The substrate support 108 is adapted to support a substrate, such as a semiconductor substrate, thereon during processing within the process chamber 100. The substrate support 108 may be formed from an optically transparent material, such as quartz, to facilitate the heating of the substrate 108 using optical radiation.

Plenums 110 are coupled to the chamber body 102 and are adapted to provide and remove one or more process gases to/from the process region 106 during processing. In one example, a first plenum 110 may be adapted to provide a process gas to the process region 106, while a second plenum 110 may be adapted to remove reactant by-products and unreacted process gas from the process region 106. Process gas entering the process chamber 100 through a plenum 110 is directed over a pre-heat ring 112 prior to entering the process region 106. The pre-heat ring 112 may be formed from silicon carbide or graphite and facilitates heating for of the process gas while providing edge protection to the substrate 108. The pre-heat ring 112 includes a circular opening disposed centrally therethrough. The opening has a diameter less than the substrate 108, such as about 1 millimeter less to about 10 millimeters less, in order to cover the edge of the substrate 108 during processing. The pre-heat 112 is actuatable from a process position (as shown in FIG. 1A) and a raised position above the process position which facilitates removal of the substrate 108 from the process chamber 100.

The process chamber 100 also includes a lamp array 114 disposed in a lower portion of a chamber body 102. The lamp array 114 includes a plurality of lamps 116, such as incandescent lamps, arranged in a close-packed hexagonal array. The lamp array 114 may be subdivided into zones of lamps 116 that may be controlled individually. The lamp array 114 is adapted to direct optical radiation towards the substrate 108 to rapidly elevate the temperature of the substrate 108 to a desired processing temperature. For example, the substrate 108 may be heated from about 20 degrees Celsius to about 800 degrees Celsius or about 1200 degrees Celsius to perform an anneal process on the substrate 108. In another example, the substrate 108 may be heated to a temperature less than about 400 degrees Celsius or less than about 300 degrees Celsius.

The lid 104 includes a reflector plate 118 disposed on a lower surface thereof adjacent to the process region 106. The reflector plate 118 is adapted to reflect optical radiation back to the upper surface of substrate 108 to provide more efficient heating of the substrate 108 and facilitate temperature control of the lid 104. To further facilitate temperature control of the lid 104, the lid 104 includes cooling passages 120 formed in a cooling body 121 to allow a cooling fluid to flow therethrough to remove heat from the lid 104 via a heat exchanger (not shown).

The lid 104 includes an opening therethrough to accommodate a probe 122. The opening to accommodate the probe 122 may be centrally disposed relative to the substrate 108 and lamp array 114, or may be offset from the centers thereof. The probe 122 includes optical elements therein to facilitate transferring of an image of the internal chamber volume, for example, including the lamp array 114, to an imaging device 125, such as a camera, for example a CCD camera. A wide-angle lens 124 (e.g., a "fish eye" lens) is disposed at the lower end of the probe 122. The wide-angle lens 124 may have a viewing angle of about 160 degrees to about 170 degrees, such as about 163 degrees to facilitate viewing of the all the lamps 116 of the lamp array 114, or a majority of the lamps 116 of the lamp array 114. The probe may be formed, for example, from aluminum or an alloy thereof.

The probe 122 is disposed through the reflector plate 118 and the cooling body 121 and extends to a imaging device 125 to transmit an image thereto. The probe 122 is secured in place via a bracket 126 coupled to an upper surface of the lid 104. A seal 128 is disposed around the probe 122 between the probe 122 and the bracket 126 to mitigate the escape of process gases from the processing region 106. The probe may have a length of about 2 inches to about 1 foot, for example, about 5 inches to about 7 inches, to distance the imaging device 125 from the process region 106, thereby subjecting the imaging device 125 to less heat, thus reducing the likelihood of damage to the imaging device 125.

The imaging device 125 is adapted to receive an image of lamp array 114 and transfer the image to a control unit 130. The control unit 130 may be, for example, and computer, and include one or more processors or memories to facilitate the computing of data. In one example, the control unit 130 is adapted to receive data, such as an image, form the imaging device 125 and compare the image to a second image (e.g. a reference image) stored in a memory of the computer. Based on the comparison results, the control unit 130 may cause a change in process conditions via closed-loop control, or may present a message on a graphical user interface. For example, the control unit 130 may increase the power applied to one or more lamps, thus increasing intensity, or may present a message on a graphical user interface indicating failure of a particular lamp. Other indicators of lamp failure are also contemplated.

Figure 2:
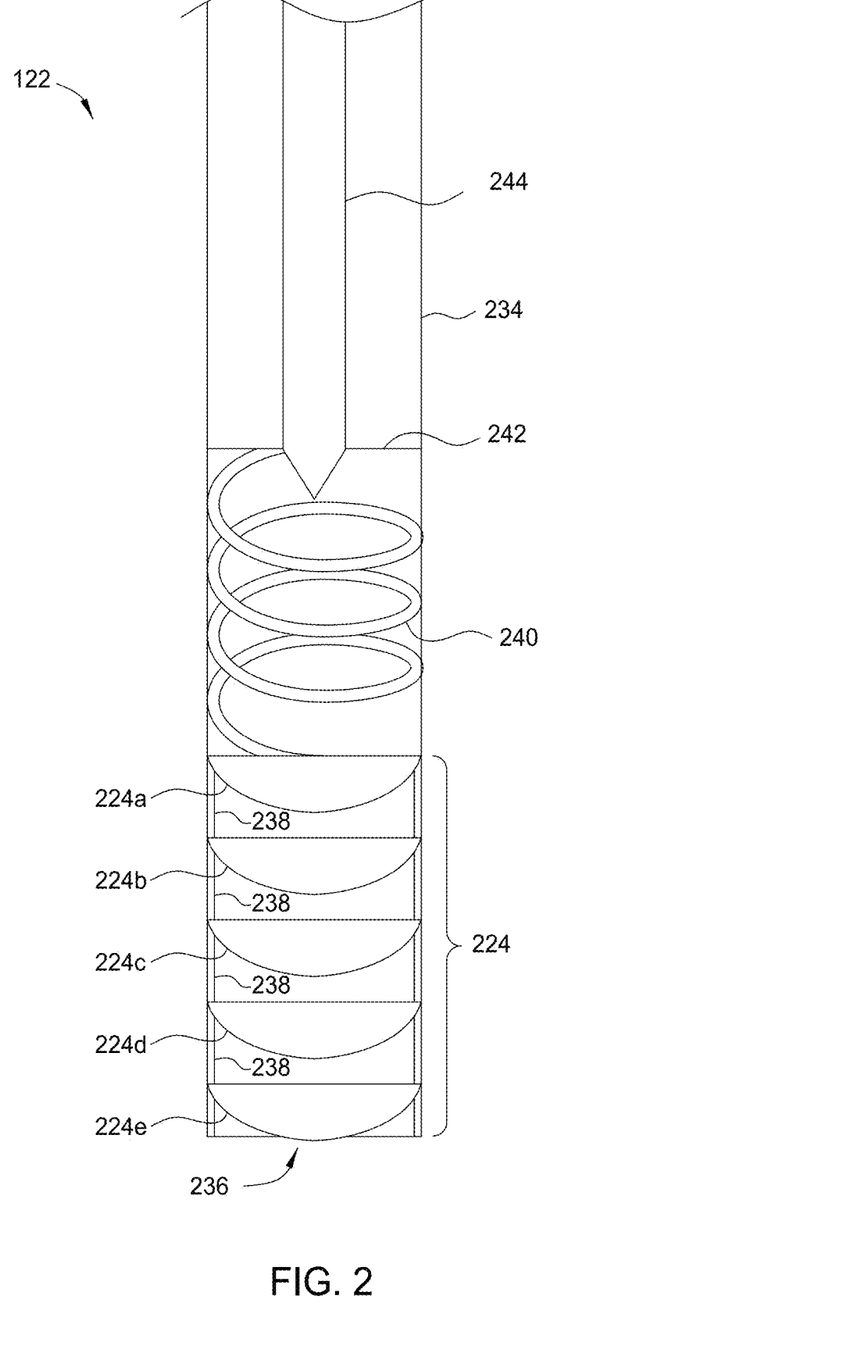
FIG. 2 is a partial schematic illustration of a probe, according to one embodiment of the disclosure.

FIG. 2 is a partial schematic illustration of a probe 122, according to one embodiment of the disclosure. The probe 122 includes a housing 234, such as a stainless steel tube. A wide-angle lens 224 is disposed in a lower portion of the housing adjacent to an aperture 236. The aperture 236 may have a relatively small diameter, such as about 3 millimeters to about 7 millimeters, to limit the amount of optical radiation that enters the probe 122, thereby reducing undesired heating of the probe 122. The wide-angle lens 224 includes 5 lenses 224a-e positioned vertically above one another. The lenses 224a-e may be formed from glass or quartz and are separated by spacers 238 disposed along the inner surface of the housing 234. The utilization of multiple lenses 224a-e facilitates a wider viewing angle than a single lens having the combined thickness and the same curvature. It is to be understood that the inclusion of 5 lenses is only an example, and more or less than 5 lenses may be utilized in the probe 122.

The lenses 224a-e are secured in place using a spring 240 that coils around the inner surface of the housing 234. The spring 240 abuts a spring support 242 disposed within the housing 234, and exerts pressure against the uppermost lens 224a. The force is then transferred through the supports 238 and remaining lenses 224b-e to secure the lenses 224a-e against the bottom portion of the housing 234. In this manner, the use of glues or other bonding compounds, which can degrade in the high temperature atmosphere of the processing region 106, can be avoided. In one embodiment, the lenses 224a-e have the same curvature on a surface thereof. However, it is contemplated that the curvature of the lenses 224a-e may be different in order to effect the desired field of view from the wide-angle lens 224.

A gradient index (GRIN) rod lens 244 is disposed through an opening centrally formed in the spring support 242. The GRIN rod lens 244 achieves focus via a continuous change of the refractive index within the lens material. The GRIN rod lens 224 may be coupled to an optics assembly, for example, a lens of the camera (shown in FIG. 1A) to facilitate focusing of the image for capture by the imaging device 125. In one embodiment, the a top surface of the GRIN rod lens 224 may be sealed with an epoxy to provide a vacuum-tight seal within the probe 122.

Prior art attempts to capture images of lamp arrays with cameras were unsuccessful because the prior optic assemblies were unable to withstand the high temperatures generated by the lamp arrays in the proximity of the process region. The utilization of the probe 122 facilitates use adjacent a high temperature environment due to the ability of the probe 122 to withstand high temperatures and large temperature fluctuations, thereby allowing along the use of a camera without harming the imaging device 125 or probe 122 due to excessive heat. During processing, the probe 122 may reach temperatures of about 800 degrees Celsius or less, such as about 400 degrees Celsius or less. However, as illustrated in FIG. 1A, the probe 122 passes through the cooling body 121, which assists in temperature management of the probe 122 by removing heat therefrom.

FIG. 2 illustrates one embodiment of a probe 122; however, additional embodiments are also contemplated. In another embodiment, it is contemplated that the wide-angle lens 224 may contain more or less lenses than lenses 224a-e, as is needed to obtain the desired viewing angle.

Figure 3A:
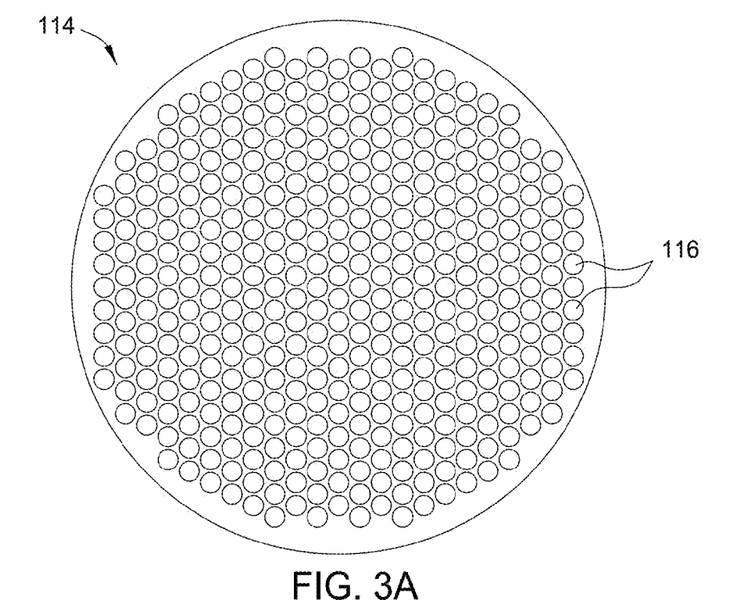
FIG. 3A illustrates a top view of a lamp assembly, according to one embodiment of the disclosure.

FIG. 3A illustrates a top view of a lamp assembly 114, according to one embodiment of the disclosure. The lamp assembly 114 includes a plurality of lamps 116 arranged in a hexagonal close-packed arrangement. It is contemplated that the lamp assembly 114 may include more or less lamps 116 than shown, and further, that the lamps 116 may be positioned in alternative arrangements.

Figure 3B:
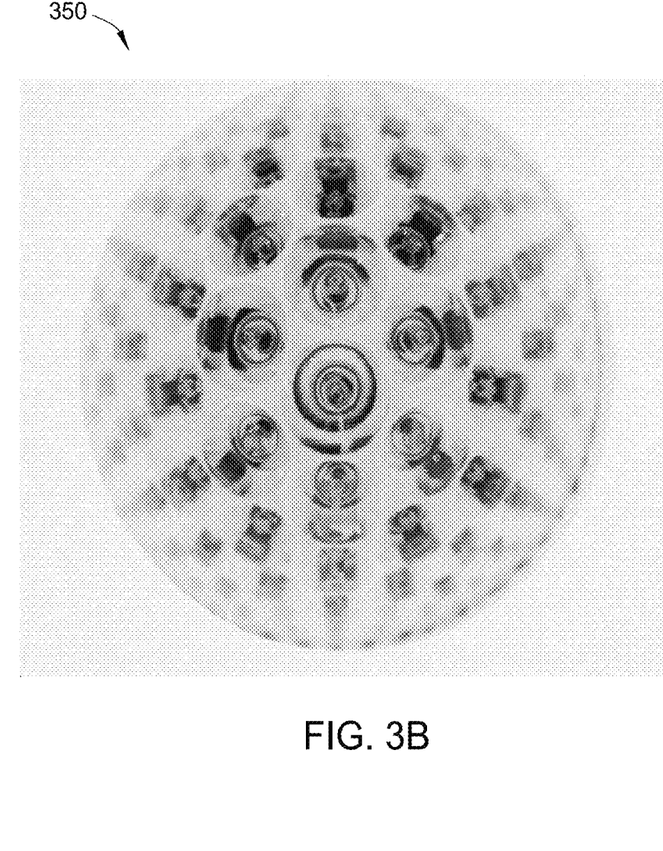
FIG. 3B illustrates the lamp assembly of 3A as viewed through a wide-angle lens.

FIG. 3B illustrates a captured image 350 the lamp assembly 114 of 3A as viewed through a wide-angle lens, such as the wide-angle lens 224 illustrated in FIG. 2. The wide-angle lens allows for viewing of substantially all the lamps 116 even though the lamps 116 are positioned relatively close to the wide-angle lens. For example, the distance between the lamps 116 and the wide-angle lens may be less than about 5 inches or about less than 3 inches. The utilization of the wide-angle lens 224 allows the chamber volume to kept relatively small.

The image illustrated in FIG. 3B is captured by a camera, such as the imaging device 125 (shown in FIG. 1A), and then transferred to a control unit. The control unit compares the captured image to a baseline image of the lamps 116 stored on the control unit. The baseline image is an image of the lamps 116 all functioning at a desired output level. By comparing the baseline image to the captured image in FIG. 3B, the control unit can determine if one of the lamps 116 is burned out, has a lower intensity than desired, or a greater intensity than desired. The control unit can then optionally display a message indicating which particular lamp 116 differs from the baseline image, and whether the lamp is burned out, has a greater output than the baseline, or has a lower output than the baseline. The control unit may also adjust the output any lamps using closed-loop feedback.

In one example, the control unit may include an algorithm to convert the captured wide-angle image shown in FIG. 3B into a more conventional, planar image. It is contemplated that converting the image from a wide-angle format may expedite the process of comparing the image to the baseline image.

In one embodiment, it is contemplated that the captured image, such as FIG. 3B, may be obtained while a substrate is in the process chamber. A silicon substrate is transparent to infrared wavelengths if the temperature of the substrate is below about 400 degrees Celsius, thus allowing for lamp failure detection before the silicon substrate is annealed. In another embodiment, it is contemplated that the captured image may be obtained after a substrate has been removed from the process chamber. For example, an image may be captured between processes during substrate transfer. Because the lamps can be powered up in a relatively short time, such as less than 3 seconds, the lamps can be tested during transfer without a delay in processing.

In some embodiments, it is contemplated that the pre-heat ring 112 may partially obstruct the view of the outer lamps 116 in the lamp array 114 when the pre-heat ring is in a lowered position, as shown in FIG. 1A. Thus, it is contemplated that the pre-heat ring 112 may be raised prior to capturing an image of the lamp array 114. Alternatively, an image of the lamp array 114 may be captured when the pre-heat ring is in a lowered position. In such an embodiment, lamps covered by the pre-heat ring 112 may refract off of visible lamps 116 within the process chamber 100. The baseline image would also contain the same refractions, and the control unit can be adapted to compare not only the images of the lamps 116 but also the refractions from the covered lamps when determining lamp failure or lamp output. In yet another embodiment, a plurality of images may be captured, where each image is captured for a single, lighted zone of the lamp array. Capturing an image for a single zone, such as a zone covered by the pre-heat ring 112, would allow refractions to be more easily recognized and compared. In another embodiment, the probe may include a photodector. In such an embodiment, the lamps covered by a pre-heat will be illuminated, while the remaining lamps are powered off. The photodector may then detect a light level within the process chamber, and forward the detected value to the control unit for comparison. Based on the comparison by the control unit, more detailed analysis, such as zone-by-zone image capturing, may be performed to isolate undesired lamp performance.

Figure 4:
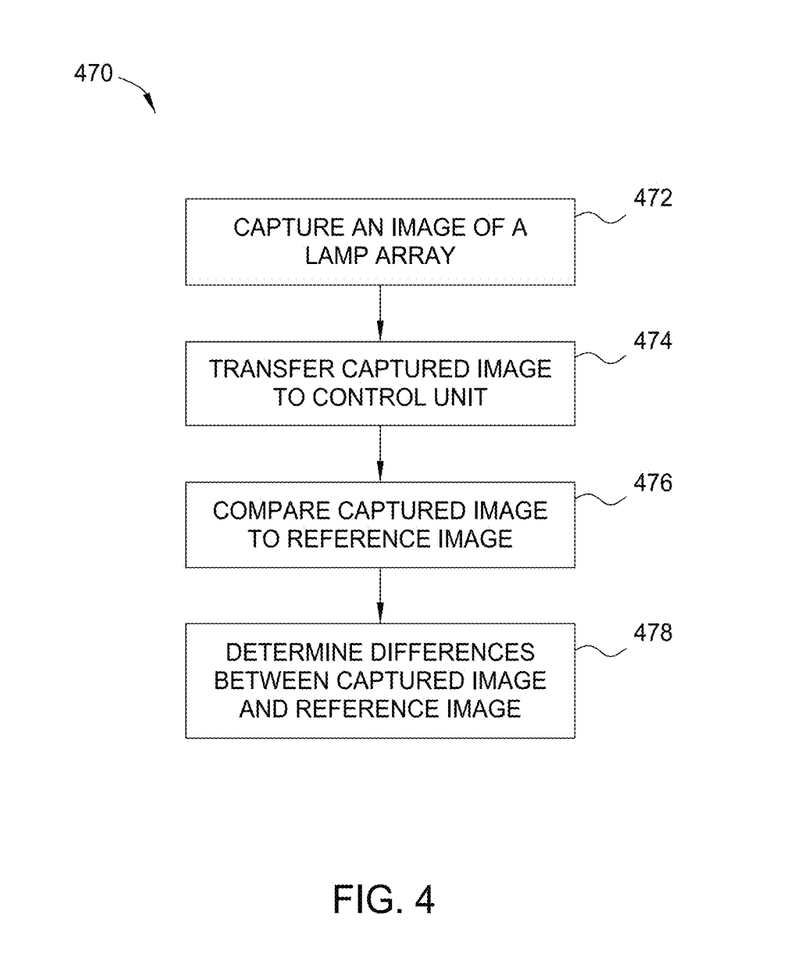
FIG. 4 illustrates a flow diagram of a method of monitoring lamp performance, according to one embodiment of the disclosure.

FIG. 4 illustrates a flow diagram 470 of a method of monitoring lamp performance, according to one embodiment of the disclosure. Flow diagram 470 begins at operation 472. In operation 472, an image of a lamp array (while powered on) within a process chamber is captured using a wide-angle lens, such as the wide-angle lens 124 within the probe 122 (shown in FIG. 1B). The captured image is then transferred to a control unit, such as control unit 130 shown in FIG. 1A, in operation 474. The control unit facilitates comparison of the captured image to a reference image stored on the control unit in operation 476. The reference image is an image of the lamp array operating under desired conditions, for example, with all lamps providing a desired output. In operation 478, the captured image is compared to the reference in order to determine the differences therebetween. Any differences between the captured image and the reference image indicate that one or more lamps within the lamp array are operating at undesired conditions, or not operating at all.

After having determined that one or more lamps are not performing as desired, the control unit may correct the lamp operating via closed-loop control, for example, by increasing power to under-performing lamps or decreasing power to over-performing lamps. It is contemplated that lamps within the lamp array may be controlled individually, or that lamps within a single zone may be controlled together. Additionally or alternatively, the control unit may also provide an indication that one or more lamps are not functioning (e.g., burned out), if appropriate. In such an instance, the control unit may indicate on a graphical user interface that a lamp is burned out, and may also provide identification of the particular lamp that is burned out. Identification of the burned out or otherwise non-functioning lamp may be provided on a schematic illustration of the lamp array, or provided numerically, where each number corresponds to a distinct lamp or zone of lamps. Thus, the burned out lamp can be quickly replaced without additional troubleshooting.

Figure 5A:
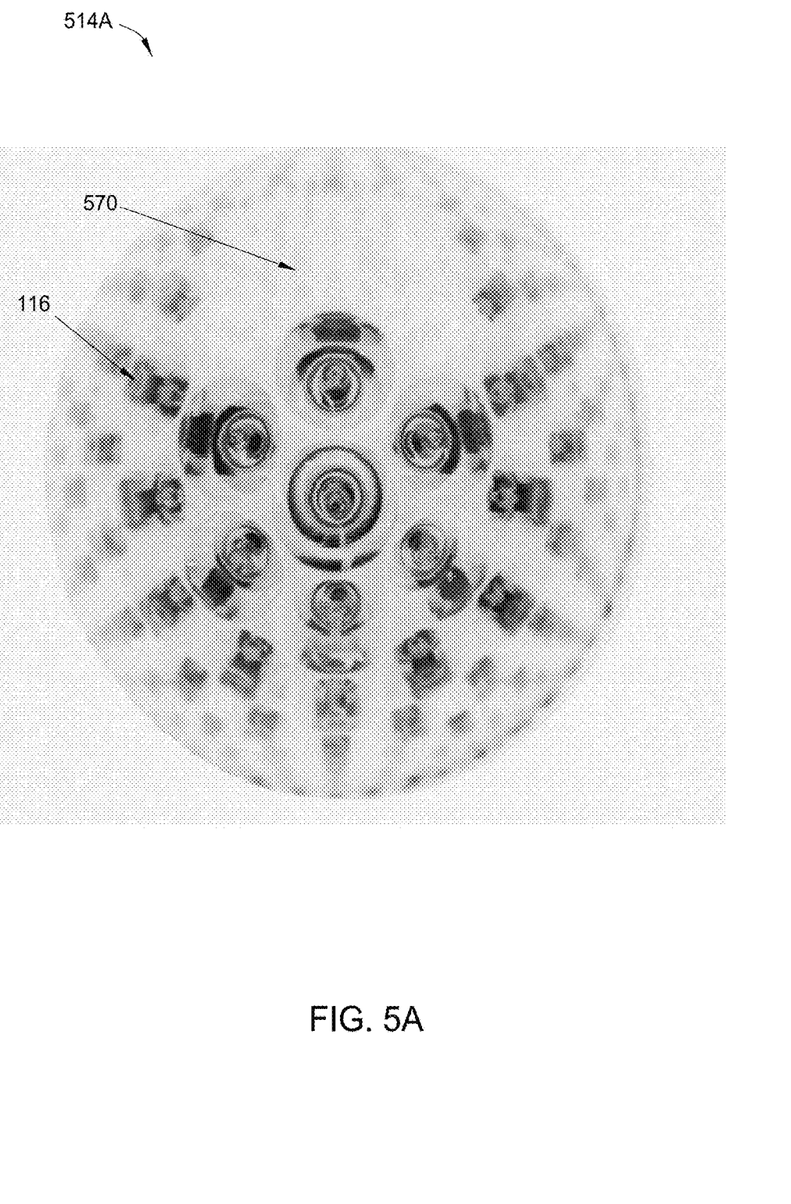
FIGS. 5A-5C illustrate images of lamp arrays, according to embodiments of the disclosure.
Figure 5B:
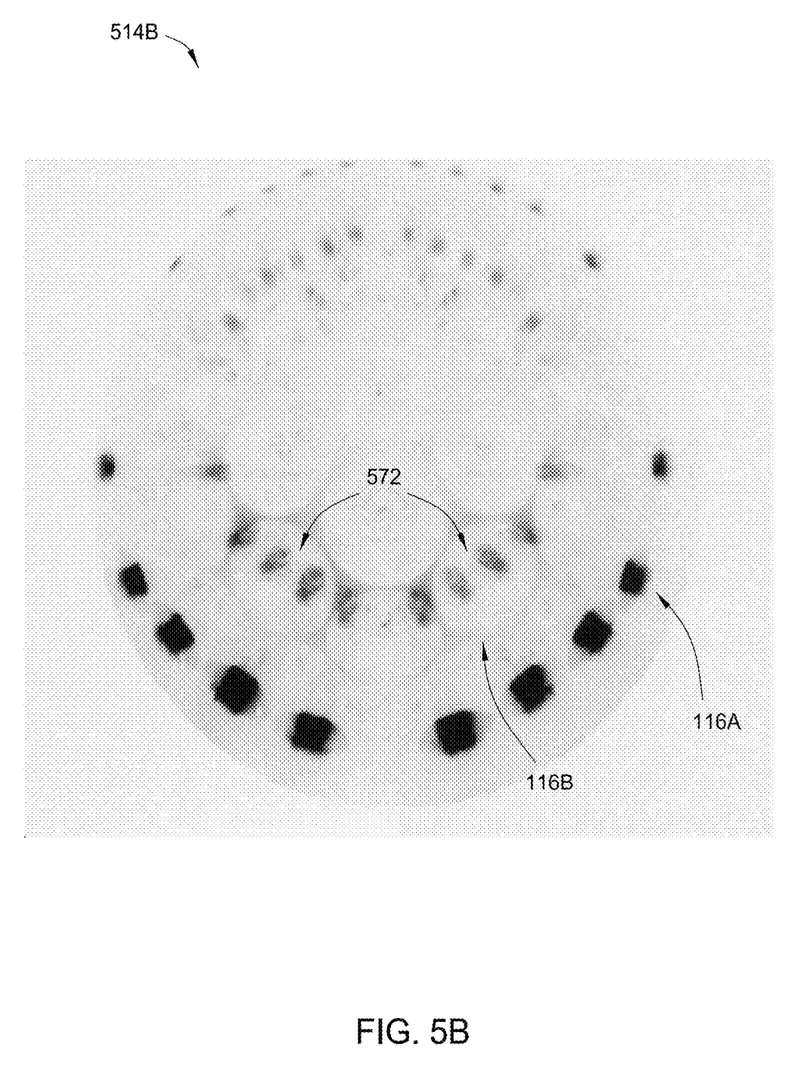
Figure 5C:
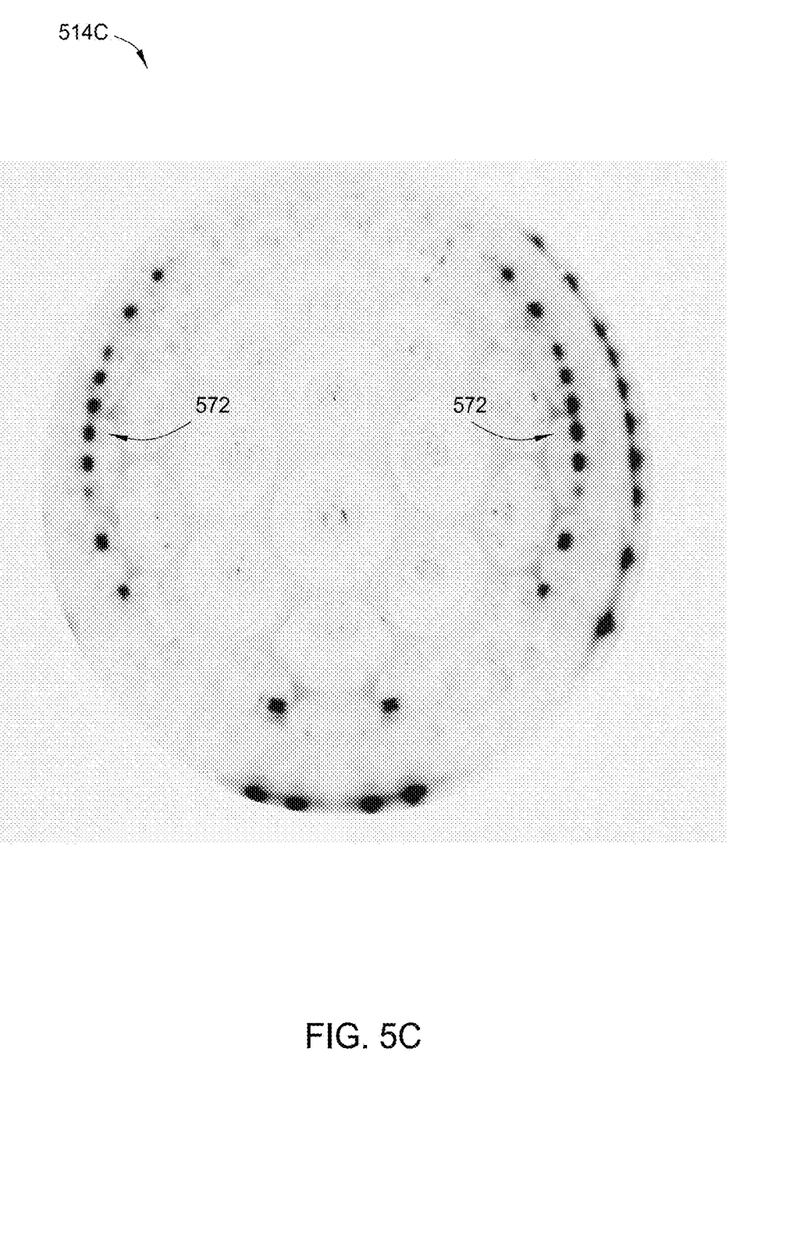

FIGS. 5A-5C illustrate images of lamp arrays, according to embodiments of the disclosure. FIG. 5A illustrates a lamp array 514a. The lamp array 514a is similar to lamp array 114, however, several lamps 116 are not functioning, as indicated by the spot 570. The image shown in FIG. 5A can be compared to a reference image stored in control unit, thus facilitating accurate and timely identification of the non-functioning lamps.

FIG. 5B illustrates a lamp array 514b. The lamp array 514b, as shown, has only a single lamp zone powered up in order to illustrate the refraction 572 of the powered lamps 116a visible in the non-powered lamps 116b. When desirable, a control unit can compare the refraction of lamps (both position and intensity) to determine whether lamps are operating as desired.

FIG. 5C illustrates a lamp array 514c which includes a powered lamp zone that is not visible due to an overlying pre-heat ring. However, as illustrate, the refractions 572 form the powered lamps are visible, thus facilitating comparison with a reference image to determine whether lamps are operating desirably. It is contemplated that non-visible lamp zones may be powered on individually, or that multiple non-visible lamp zones may be powered on simultaneously. The non-visible lamp zones may be powered on simultaneously with visible lamp zones, as long as refractions are still discernible.

Figure 6A:
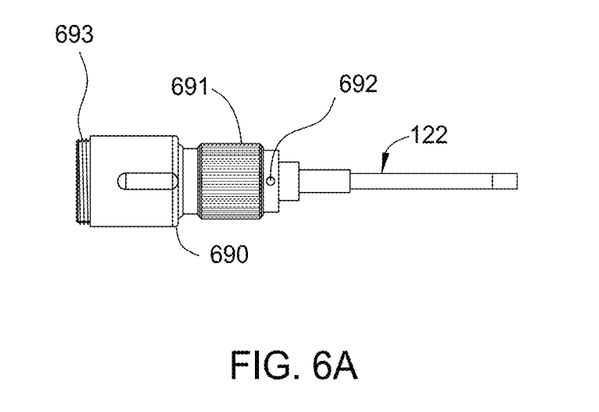
FIGS. 6A illustrates a probe coupled to optics of a camera.

FIGS. 6A illustrates a probe 122 coupled to optics 690 of a imaging device 125 (shown in FIG. 1A). The probe 122 may be coupled to a focusing section 691 of the optics 690, and secured via a set screw 692. The optics 690 may be secured to the imaging device 125 using the threaded coupling 693.

Figure 6B:
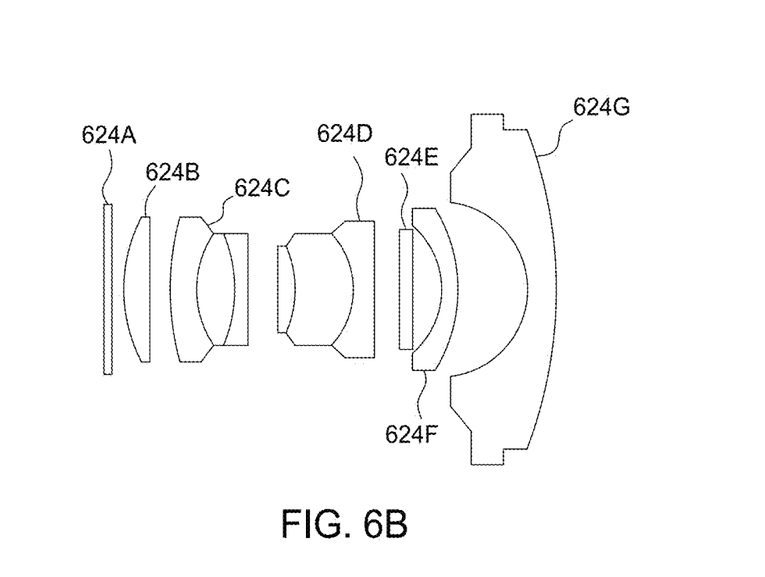
FIG. 6B illustrates a wide angle lens assembly, according to another embodiment of the disclosure.

FIG. 6B illustrates a wide angle lens assembly 624, according to another embodiment of the disclosure. The wide angle lens assembly includes lenses 624A-624G to facilitate a desired viewing angle within a process chamber. The wide angle lens assembly may be disposed within a probe 122. As illustrated by FIG. 6B, the lenses 624A-624G may have different shapes and curvatures, as desired, in order to effect the desired viewing angle.

Benefits of the disclosure include optical identification of lamp failure, and closed-loop control of lamp arrays using captured images. Because lamp failure is determined visually using a camera and probe rather than current sensors, the failed lamp of the lamp array can be identified more quickly and without the need for additional diagnostics.

While the foregoing is directed to embodiments of the present disclosure, other and further embodiments of the disclosure may be devised without departing from the basic scope thereof, and the scope thereof is determined by the claims that follow.

What is claimed is:

1. A process chamber, comprising:
a chamber body;
a lamp array coupled to the chamber body;
a chamber lid disposed over the chamber body;
a probe comprising a gradient index rod lens disposed through an opening in the chamber lid, the probe having a wide-angle lens at one end thereof; and
an imaging device to capture an image of the lamp array, wherein the imaging device is coupled to a second end of the probe.

2. The process chamber of claim 1, wherein the wide-angle lens comprises a plurality of lenses separated by spacers.

3. The process chamber of claim 1, wherein the probe comprises a housing and a spring positioned therein.

4. The process chamber of claim 3, wherein the housing comprises stainless steel.

5. The process chamber of claim 1, further comprising a control unit coupled to the imaging device, the control unit adapted to receive an image from the imaging device.

6. The process chamber of claim 1, wherein the chamber lid includes a cooling body having cooling channels therein, and wherein the probe is disposed through the cooling body.

7. The process chamber of claim 1, wherein the wide-angle lens comprises five or more lenses.

8. A process chamber, comprising:
a chamber body;
a lamp array disposed in the chamber body;
a chamber lid disposed over the chamber body;
a probe comprising a gradient index rod lens disposed through an opening in the chamber lid, the probe having a spring at a first end thereof and a wide-angle lens at a second end thereof, the wide-angle lens comprising a plurality of lenses separated by spacers; and
an imaging device coupled to a second end of the probe, the imaging device adapted to capture an image of the lamp array.

9. The process chamber of claim 8, wherein the chamber lid includes a cooling body having cooling channels therein, and wherein the probe is disposed through the cooling body.

10. The process chamber of claim 8, further comprising a control unit coupled to the imaging device, the control unit adapted to receive an image from the imaging device.

11. The process chamber of claim 10, wherein the control unit facilitates comparison of a captured image to a reference image.

12. The process chamber of claim 11, wherein the lamp array includes a plurality of zones.

13. The process of claim 12, wherein the control unit is adapted to control power applied to each of the plurality of zones.

14. The process chamber of claim 11, wherein the control unit is adapted to control power applied to each lamp of the lamp array.

15. A process chamber, comprising:
a chamber body;
a lamp array coupled to the chamber body;
a chamber lid disposed over the chamber body;
a probe disposed through an opening in the chamber lid, the probe having a wide-angle lens at one end thereof, the probe positioned about five inches or less from the lamp array; and
an imaging device to capture an image of the lamp array, wherein the imaging device is coupled to a second end of the probe.

16. The process chamber of claim 15, wherein the probe is comprises a gradient index rod lens.

17. The process chamber of claim 16, wherein the probe is positioned about three inches or less from the lamp array.

18. The process chamber of claim 17, wherein the chamber lid includes a cooling body having cooling channels therein, and wherein the probe is disposed through the cooling body.

19. The process chamber of claim 18, wherein the probe comprises a housing and a spring positioned therein.

20. The process chamber of claim 19, wherein the housing comprises stainless steel.

21. A process chamber, comprising:
a chamber body;
a lamp array coupled to the chamber body;
a chamber lid disposed over the chamber body;
a probe comprising a gradient index rod lens disposed through an opening in the chamber lid, the probe having a wide-angle lens at one end thereof, the probe positioned about five inches or less from the lamp array; and
an imaging device, wherein the imaging device is coupled to a second end of the probe.

22. The process chamber of claim 21, wherein the probe is positioned about three inches or less from the lamp array.

* * * * *